(12) United States Patent
Knowles et al.

(10) Patent No.: US 6,465,931 B2
(45) Date of Patent: Oct. 15, 2002

(54) DEVICE AND METHOD FOR DRIVING SYMMETRIC LOAD SYSTEMS

(75) Inventors: Gareth J. Knowles, Williamsport, PA (US); Bruce Bower, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 0 days.

(21) Appl. No.: 09/819,508

(22) Filed: Feb. 28, 2001

(65) Prior Publication Data
US 2001/0035696 A1 Nov. 1, 2001

Related U.S. Application Data
(60) Provisional application No. 60/192,887, filed on Mar. 29, 2000.

(51) Int. Cl.[7] .............................................. H01L 41/08
(52) U.S. Cl. ...................... 310/316.01; 307/11; 307/17; 307/20; 310/317; 310/319; 310/323.02; 310/328; 310/331; 363/17; 363/132
(58) Field of Search ........................... 310/316.01, 317, 310/319; 307/11, 15–21; 323/268, 277, 289; 363/17, 98, 132

(56) References Cited

U.S. PATENT DOCUMENTS

| 3,902,084 A | | 8/1975 | May, Jr. | |
|---|---|---|---|---|
| 3,902,085 A | | 8/1975 | Bizzigotti | |
| 4,291,366 A | * | 9/1981 | Nelson | 363/17 |
| 4,674,026 A | * | 6/1987 | Tanaka | 363/160 |
| 4,874,979 A | | 10/1989 | Rapp | |
| 4,882,664 A | * | 11/1989 | Pennington | 363/41 |
| 4,950,135 A | | 8/1990 | Tojo et al. | |
| 4,992,919 A | * | 2/1991 | Lee et al. | 363/17 |
| 5,077,486 A | * | 12/1991 | Marson et al. | 307/95 |
| 5,497,072 A | * | 3/1996 | Le Comte et al. | 323/289 |
| 5,546,300 A | * | 8/1996 | Lee et al. | 363/132 |
| 5,699,238 A | * | 12/1997 | Lee et al. | 363/21 |
| 5,723,915 A | * | 3/1998 | Maher et al. | 307/131 |
| 5,751,090 A | | 5/1998 | Henderson | |
| 6,011,345 A | | 1/2000 | Murray et al. | |
| 6,191,568 B1 | * | 2/2001 | Poletti | 323/268 |

FOREIGN PATENT DOCUMENTS

EP        0 375 570 B1      11/1995

* cited by examiner

Primary Examiner—Mark O. Budd
(74) Attorney, Agent, or Firm—Michael G. Crilly, Esq.

(57) ABSTRACT

The invention described herein is a novel power circuit capable of electrically driving devices whose mechanical action is accomplished by induced strain transducers. The power circuit neither recycles nor dissipates the energy returned from the near lossless transducer, instead redirects power either to another transducer of the same type or to the transducer itself. The invention is based on a balanced capacitive loading method wherein the load itself acts as the energy storage element in the energy balance system. In the preferred mode, the circuit directs power to a symmetric couple where both loads in the couple consist of one or more transductive elements. The invention eliminates the need for a large power-supply bypass capacitor in driving reactive loads thereby reducing the peak power handled by the d.c. power section.

20 Claims, 9 Drawing Sheets

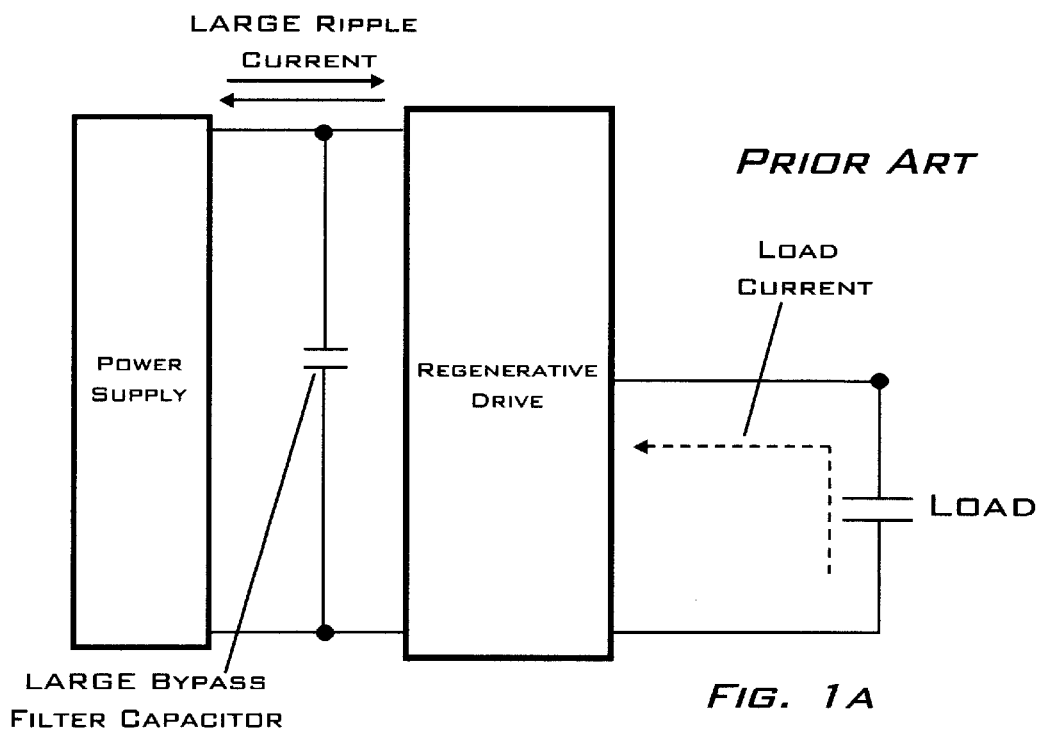
FIG. 1A
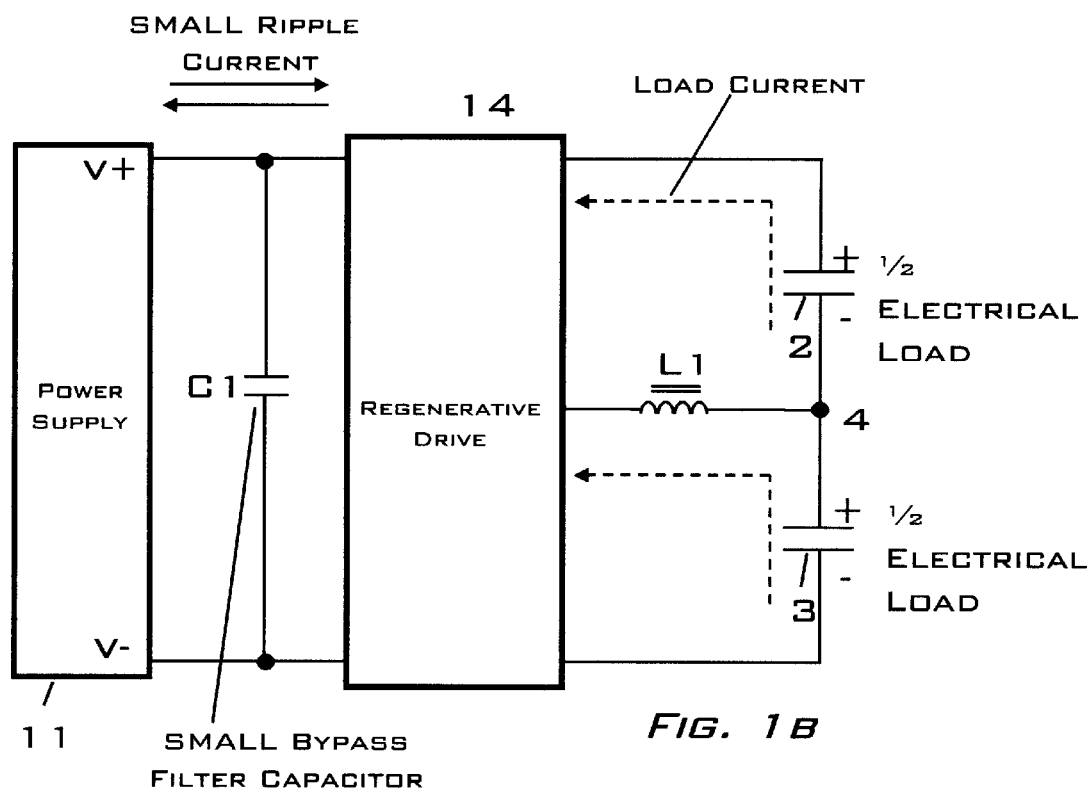
FIG. 1B
FIGURE 1

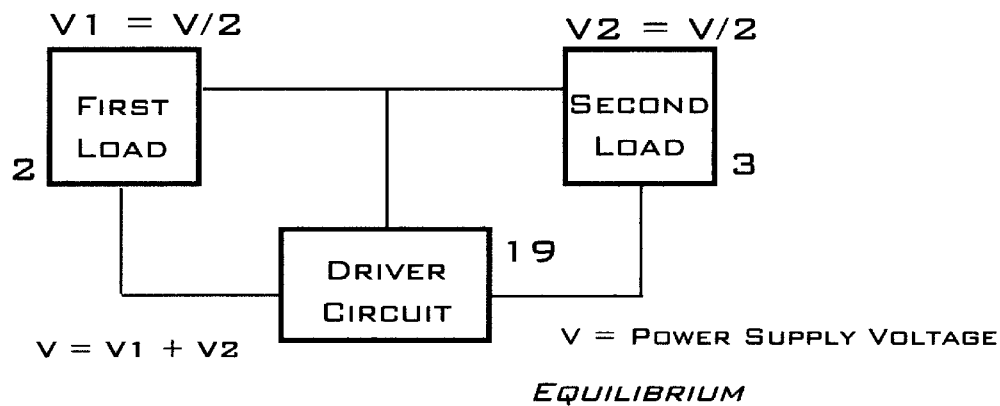
FIG. 2A
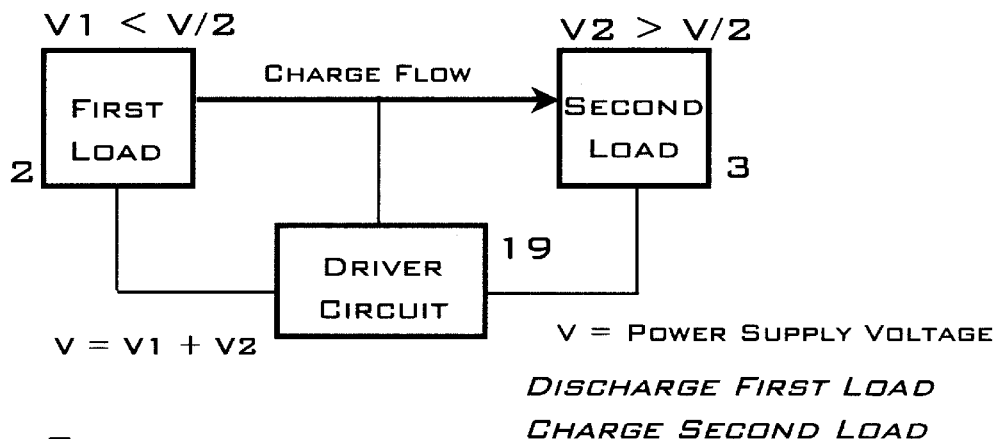
FIG. 2B
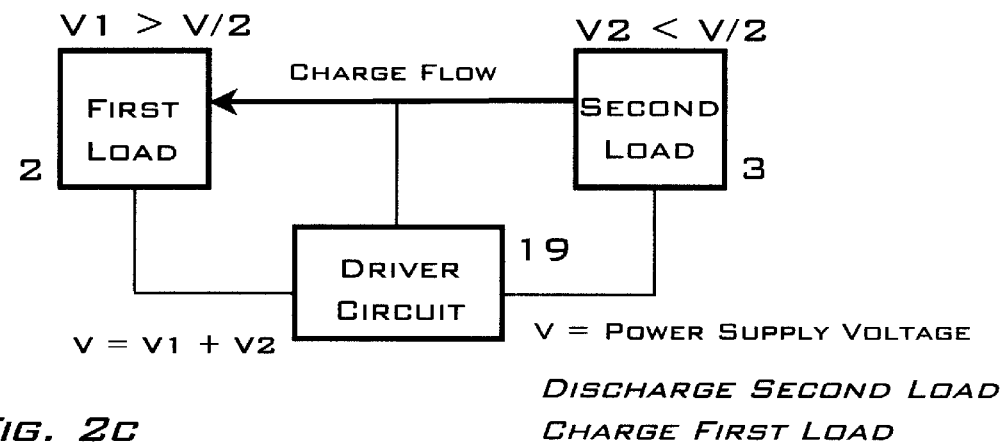
FIG. 2C
FIGURE 2

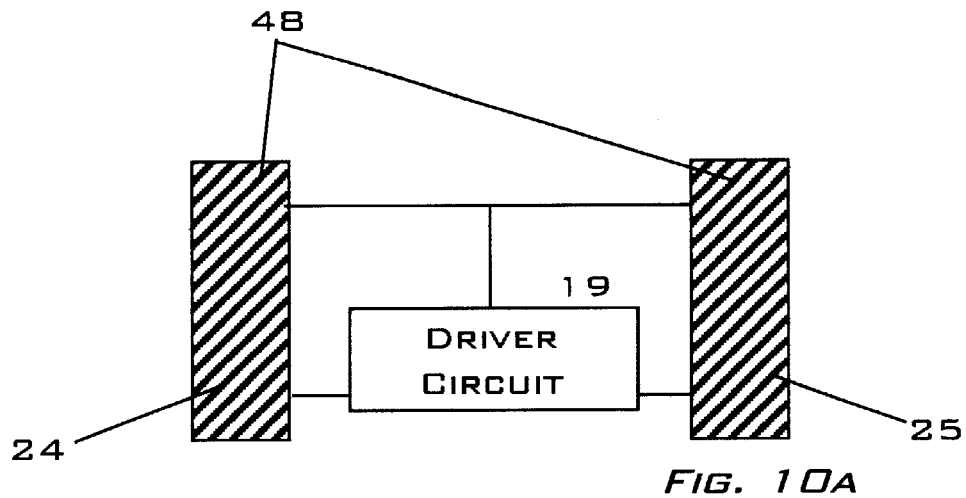
FIG. 10A
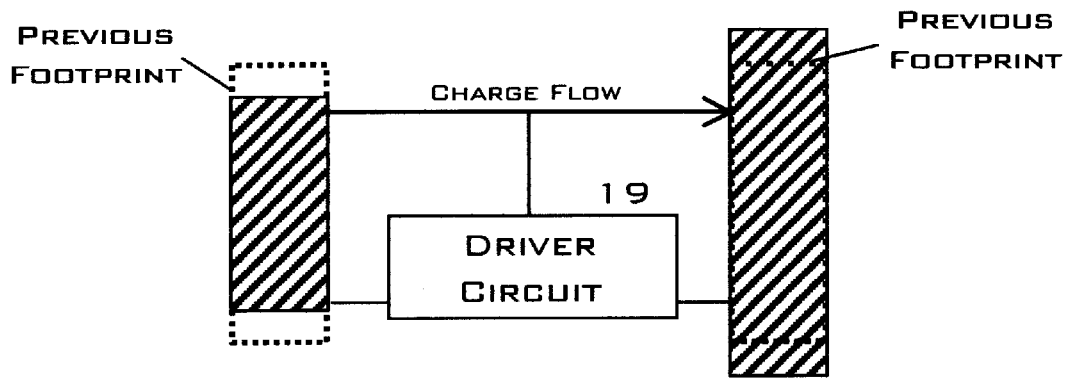
FIG. 10B
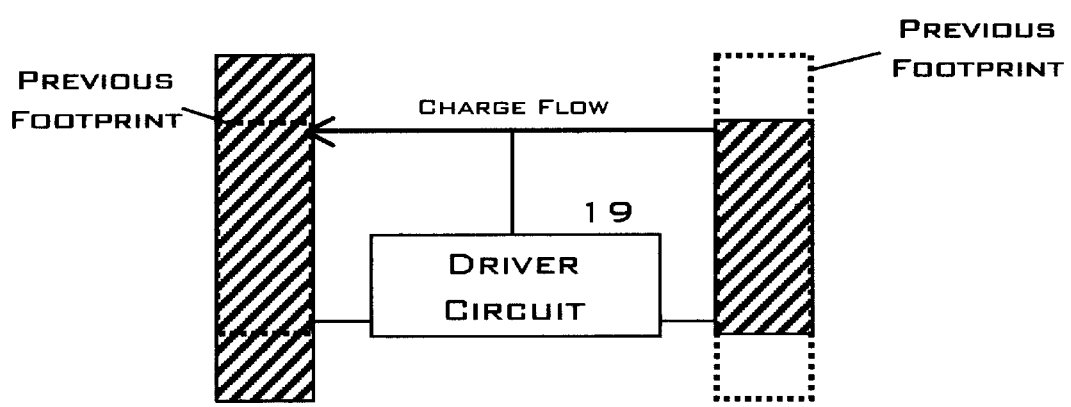
FIG. 10C
FIGURE 10

DEVICE AND METHOD FOR DRIVING SYMMETRIC LOAD SYSTEMS

CROSS-REFERENCE TO RELATED APPLICATIONS

This application claims benefit under 35 U.S.C. 119(e) from U.S. Provisional Application No. 60/192,887 filed on Mar. 29, 2000.

FEDERALLY SPONSORED RESEARCH OR DEVELOPMENT

None.

BACKGROUND OF THE INVENTION

1. Field of the Invention

The present invention generally relates to a driver circuit for a variety of symmetric load systems. The invention specifically describes a power circuit based on a balanced capacitive loading method wherein the load itself acts as an energy storage element in the energy balance system. In preferred embodiments, the circuit redirects power from a near lossless load to either another load of the same type or to a capacitively equal inactive element. At any given time, a portion of the symmetric load system acts as an actuator and the remaining pure capacitive portion functions similar to a power bypass capacitor.

2. Related Arts

A large class of active control devices incorporate small, high-force transductive mechanisms to develop mechanical force. Electrostriction mechanisms develop mechanical force by the interaction of electric fields within the transducer. Magnetostriction mechanisms develop mechanical force by the interaction of magnetic fields within the transducer. Transductive mechanisms are inherently lossless, therefore the energy pumped into the device is returned except for a small portion expended producing mechanical work.

Various power circuits are known within the art to drive transductive mechanisms. Linear driver circuits are the most common approach. Linear drivers are very inefficient in that return energy from the transductive mechanism is dissipated thermally and thereby no longer available to drive the mechanism. Some improved performance is obtained with class D implementations of the electronics, however, the issue of how to store the transient return energy remains unresolved.

A more attractive solution to reverse energy flow is a regenerative driver circuit as disclosed in U.S. Pat. No. 6,001,345 issued to Murray et al. on Jan. 4, 2000. However, the invention by Murray suffers two fundamental problems. First, the invention requires a negative impedance inverter that is both quite complex to achieve and never adequately demonstrated in practice. Secondly, the invention requires a large output bypass capacitor. The capacitor value is chosen according to $$R_{Load} C_{Filter} \gg 1/F$$

where F is the ripple frequency. The ripple current is in this case impressed by the transients in and out during switching. This leads to a minimal requirement of the output bypass capacitor, where $$C_{filter} \gg C_{load}$$

as to achieve a $\omega_{3db}$ bypass. Consequently, the power bypass capacitor quickly becomes the dominating factor in terms of mass, volume, and performance at larger loads. The result is diminished advantages in terms of efficient power handling and compact implementation of the switching section in the drive topology.

The deficiencies of Murray et al. are best represented by example. Two symmetric load devices each consisting of two transductive elements are described in FIGS. 8 and 10. Two symmetric load devices each consisting of four transductive elements are described in FIGS. 11 and 12. For discussion purposes, piezo-mechanical motion is induced by piezoelectric transducers with 5.5 $\mu$F capacitance operating at 200 volts peak amplitude. The total resultant piezo-capacitance is 22 $\mu$F (4 times 5.5) for dually-opposed implementations and 44 $\mu$F (8 times 5.5) for quadrature-opposed implementations. Circulating currents from the large piezo-capacitive load has a deleterious effect on a high-voltage power supply because of high ripple causing 'gain' ripple induced at the switching amplifier output. The result is decreased stability at higher loads. A bypass capacitor one-hundred times the piezo-capacitance, 2,200 $\mu$F and 4,400 $\mu$F respectively for the examples above, is required to lower the return ripple of the recirculating current. Such bypass capacitors must operate satisfactorily within the bandwidth of the system, at a minimum several hundred hertz. Such operating conditions provide serious design challenges for both regenerative and conventional driver circuits.

Conventional power circuits are designed to drive only one side of a transductive system. When applied to a symmetrically coupled transductive system, the lossless nature of the transducers requires nearly all of the input energy returned and either transferred out the system as thermal energy or recovered and redirected. If recovered, the energy is typically recycled with additional input side energy to drive the other symmetric load at the output side of the circuitry. The recovery-recycle methodology as applied to symmetrically coupled systems by conventional circuits produces large peaks in the power supply ripple current. Consequently, such systems are inherently unstable.

What is required is a power control circuit capable of rapidly redirecting energy between loads in a symmetrically coupled arrangement and specifically a system wherein said loads are transductive elements. The circuit should substantially reduce peak power loading without increasing total power demand. The circuit should eliminate the large bypass capacitor required in the related arts, thereby facilitating a smaller, lighter package. The circuit should eliminate the power supply related stability problems inherent to regenerative and conventional electronics.

SUMMARY OF THE INVENTION

A first object of the present invention is to provide a small, lightweight electronic driver circuit eliminating the need for large d.c. power bypass capacitors to drive transducer actuated symmetric reactive load systems.

A second object of the present invention is to provide more volumetrically efficient d.c. power section by effectively removing peak power requirements, leaving only low-level average power to be serviced.

A third object of the present invention is to provide regenerative efficiency without the need for a large d.c. power bypass capacitor to drive transducer-actuated systems.

A fourth object of the present invention is to provide increased stability when electrically powering transducer-actuated symmetric reactive load systems at higher charge levels.

To these ends, the present invention provides a regenerative class D power circuit attached to a symmetrically terminated reactive load system. The power circuit incorporates a new balanced capacitive loading method using the pure reactive portion of the load itself as an energy storage element in the energy balance system. In the present invention either a half-bridge FET or dual half-bridge FET switching topology controls charge-discharge between the two halves of a symmetric reactive load system. The invention can be implemented in the preferred embodiment consisting of a single half bridge or second embodiment consisting of dual half bridges driven 180 degrees out of phase. The topology of the present invention causes energy to be cycled from one side of the symmetric output load to the other side of the symmetric output load. Half-bridge averaging in the invention is externally commanded via a control module. When half-bridge averaging is commanded, an imbalance is caused producing current to flow in one desired direction only. The invention causes the charge to equilibrate between the two symmetric output loads in reference to the new average control module charge. The load on the driver at any given instant is the total output load, while load on the d.c. power supply is only the real power to the load used plus any switching losses. A control module, one example being a PWM, is employed as to institute power flow between symmetric loads as seen on the output side of the circuit. The present invention optimizes the coupling of energy in the L/C circuit comprising the symmetric loads as seen at the output of the circuitry.

The present invention minimizes power supply conditioning bypass capacitor requirements. Conventional half-bridge power supply circuits require a large bypass capacitor to filter all of the ripple current related to driving the reactive load. FIG. 1a shows a conventional half-bridge arrangement wherein the ripple is related to $$(X_{Load} + Z_{load}) \times I_{Load}$$

In the present invention, the circuit is required only to filter the ripple current related to the real power dissipated in driving the compound symmetric, reactive or more specifically capacitive, load. In the present invention, the load is a priori symmetrically divided and this fact is used to terminate the circuit uniquely as shown in FIG. 1b. Thus, the current ripple is only related to $$X_{Load} \times X_{Load}$$

The present invention offers several key advantages over class C, class D and class D regenerative circuitry. The present invention is lighter and smaller with increased efficiency over the related arts. The present invention significantly reduces the high-voltage power supply bypass capacitor representing the largest component in class D and regenerative class D circuitry. The present invention enables larger effective output filter values in a smaller package thereby increasing robustness. Thus, the present invention enables the compact, lightweight implementation for driving high-voltage symmetric output load systems. The present invention effectively enables higher switching voltage into symmetric output reactive load systems thereby retaining the high efficiency of regenerative drivers.

The present invention is applicable to a wide range of transductive systems including bimorph mechanisms, inchworm devices examples of which are described in U.S. Pat. Nos. 3,902,084, 3,902,085, 4,874,979, and 5,751,090, quadrature MEMS (micro-electro-mechanical systems) gearing, piezoelectric powered scroll compressors an example described in U.S. Pat. No. 4,950,135, and piezoelectric activated optical communication devices. The advantage of the present invention is that it substantially reduces the instantaneous loads on the high-voltage power supply. This in turn, significantly reduces the power supply mass and volume. In contrast to power switching electronics in the related arts, the present invention is easily miniaturized due to the elimination of large power filter components.

BRIEF DESCRIPTION OF THE DRAWINGS

The invention will now be described in more detail, by way of example only, with reference to the accompanying drawings, in which:

FIG. 1 compares a conventional half-bridge switching mechanism with the present invention.

FIG. 2 describes charge transfer between two loads in series.

FIG. 10 shows an example inch-worm implementation of the present invention.

REFERENCE NUMERALS

Figure 3:
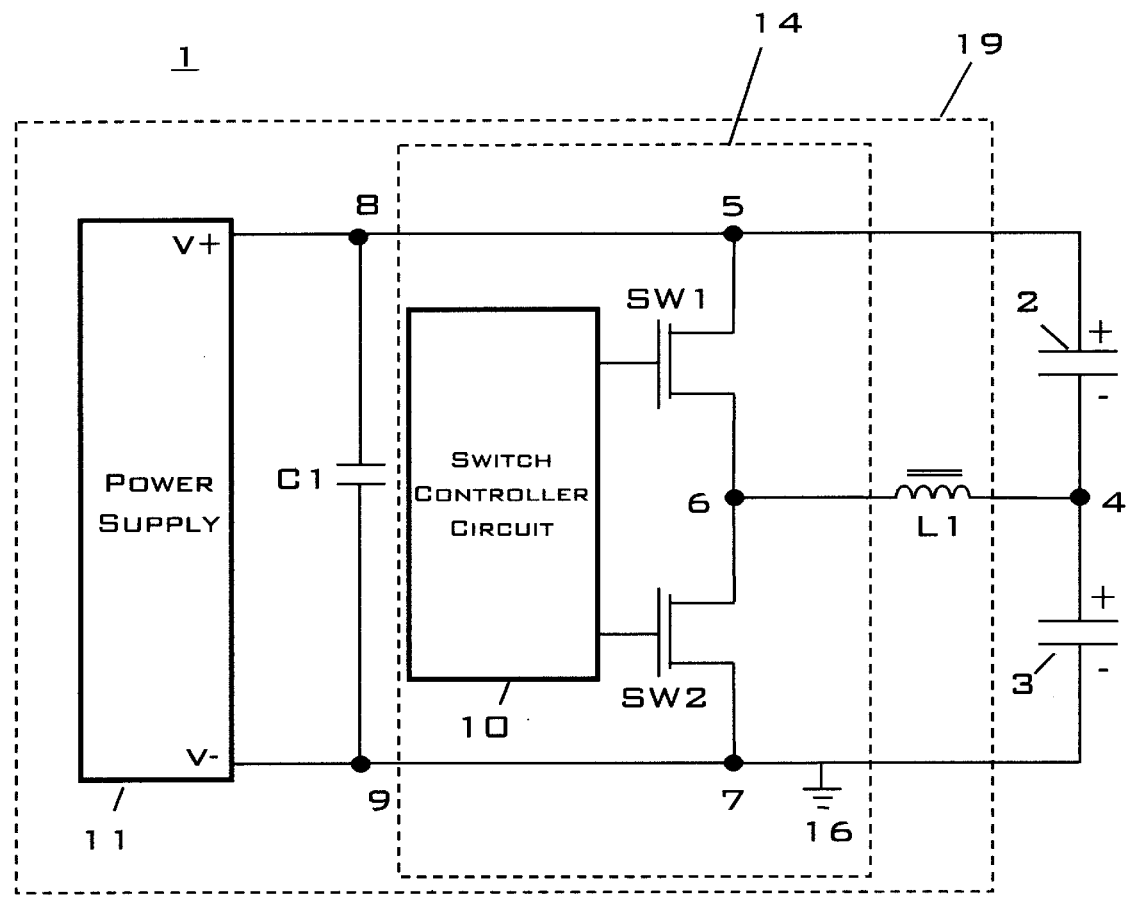
FIG. 3 shows a circuit diagram for a half-bridge embodiment of the present invention.

SW1 First switch
SW2 Second switch
L1 Filter inductor
C1 Bypass capacitor
1 Switchmode power control circuit
2 First load
3 Second load
4 Center tap
5 Node B
6 Node C
7 Node D
8 Node E
9 Node F
10 Switch controller circuit
11 Power supply
12 Node H
13 Node I
14 Regenerative drive
16 Ground
17 First single load
18 Second single load
19 Driver circuit
20 Median axis
22 First outer layer
23 Second outer layer 24 First transductive element
25 Second transductive element
26 Middle layer
27 Adhesive
28 Bimorph actuator
30 Planar configuration
31 Upper layer
32 Lower layer
40 Phase differential controller
41 First member
42 Second member
43 First actuator
44 Second actuator
45 Third actuator
46 Fourth actuator
48 Symmetric reactive load system
50 Flex tensioner
51 First tensioner
52 Second tensioner
53 Third tensioner
54 Fourth tensioner
55 First transverse element
56 Center transverse element
57 Second transverse element
58 Mechanical connector
59 Mechanical ground

DESCRIPTION OF THE INVENTION

FIG. 2 generally describes the present invention at a functional level. The invention consists of a first load 2, a second load 3, and a driver circuit 19. Both first load 2 and second load 3 have identical mechanical and electrical impedance. The driver circuit 19 provides d.c. voltage to both first load 2 and second load 3 arranged in series such that at equilibrium one-half of the total voltage (V) from the power supply 11 within the driver circuit 19 resides within the first load 2 (V/2) and the second load 3 (V/2). This condition is referred to as the equilibrated charge state and is represented in FIG. 2a.

The driver circuit 19 cycles and recycles power between the first load 2 and the second load 3 via the charge transfer process. In FIG. 2b, the driver circuit 19 directs power from the first load 2 to the second load 3. While the total voltage (V) across first load 2 and second load 3 equals the power supply 11 voltage, more voltage resides within the second load 3. In FIG. 2c, the driver circuit 19 redirects power from the second load 3 to the first load 2. Again while the total voltage (V) across first load 2 and second load 3 is equal to the power supply 11 voltage, more voltage now resides within the first load 2. In both charge flow descriptions, the driver circuit 19 alters current flow within a half-bridge topology via opening (OFF condition) and closing (ON condition) of two switches. During charge transfer, the load from which charge is directed is functionally an energy storage element facilitating the transfer process.

The switchmode power control circuit 1 including a first load 2 and second load 3 connected to a driver circuit 19. The driver circuit 19 consists of a filter inductor L1, a regenerative drive 14, a bypass capacitor C1, and a power supply 11. FIG. 3 describes the half-bridge embodiment of the switchmode power control circuit 1. First load 2 and second load 3 are connected in series at the center tap 4, node B 5, and node D 7. The negative terminal from the first load 2 is connected to the positive terminal from the second load 3 at the center tap 4. The positive terminal from the first load 2 is connected to node B 5 thereby aligning the positive terminal with the positive output on the power supply 11. The negative terminal from the second load 3 is connected to node D 7 thereby aligning the negative terminal with the negative output on the power supply 11. A filter inductor L1 is connected to the center tap 4 between first load 2 and second load 3 and node C 6 between first switch SW1 and second switch SW2. Nodes B 5, C 6, and D 7 facilitate connection of first load 2, second load 3, and filter inductor L1 to the regenerative drive 14. The regenerative drive 14 consists of a first switch SW1, a second switch SW2, and a switch controller 10. First switch SW1 and second switch SW2 are connected in series to node B 5, node D 7, and dually to node C 6 thereby parallel to both first load 2 and second load 3. A switch controller circuit 10 is connected to both first switch SW1 and second switch SW2. Parallel to both first switch SW1 and second switch SW2 and opposite of both first load 2 and second load 3 is a bypass capacitor C1 connected at node E 8 and node F 9. A power supply 11 is connected adjacent to the bypass capacitor C1. The power supply 11 is of finite impedance and applies d.c. voltage to the driver circuit 19. The power supply 11 replenishes voltage lost during switching and that portion expended by first load 2 and second load 3.

The regenerative circuit 14 is known within the art. A typical embodiment consists of a first switch SW1, second switch SW2, and switch controller circuit 10. Both first switch SW1 and second switch SW2 rapidly and alternately switch between OFF and ON, thereby adjusting current flow within the switchmode power control circuit 1 and energy flow between the first load 2 and the second load 3. Example switches SW1, SW2 include bipolar transistors, MOSFET's and IBGT's, all known within the art. The filter inductor L1 stores energy when either first switch SW1 or second switch SW2 is ON thereby providing a temporary charge flow bias at the onset of the next switching condition. The switch controller circuit 10 consists of a high-frequency PWM modulator and driver circuitry known within the art. The switch controller circuit 10 controls timing and duration of OFF and ON conditions at first switch SW1 and second switch SW2. In preferred embodiments, OFF and ON switching at both first switch SW1 and second switch SW2 occurs at frequencies in the hundreds of kilohertz. The PWM is modulated with the desired waveform, examples including but not limited to sine, square, and sawtooth waves. The bypass capacitor C1 compensates for alternating current conditions at the power supply 11 thereby eliminating current ripple. The switchmode power control circuit 1 is terminated to a ground 16 by methods known within the art.

First load 2 and second load 3 may consist of one or more capacitive elements. In the most preferred embodiment, both first load 2 and second load 3 are mechanically and electrically matched transductive element. While various embodiments are possible, the total mechanical and electrical impedance of the first load 2 closely approximate that of the second load 3. A second embodiment for non-symmetric loading conditions consists of an approximately chosen passive capacitor whose value added to none or partial existing second load 3 now matches the first load 2 in non-resonant applications.

Figure 4:
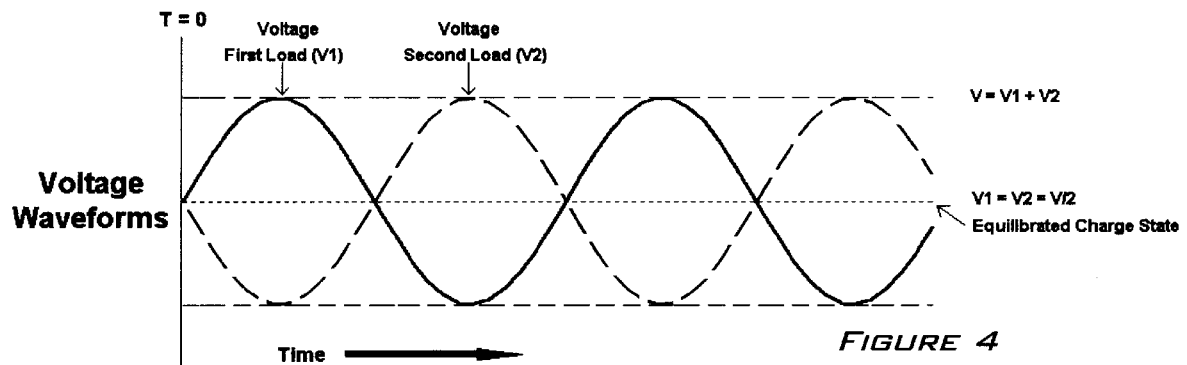
FIG. 4 graphically describes the voltage waveforms for a typical symmetric load system.
Figure 5:
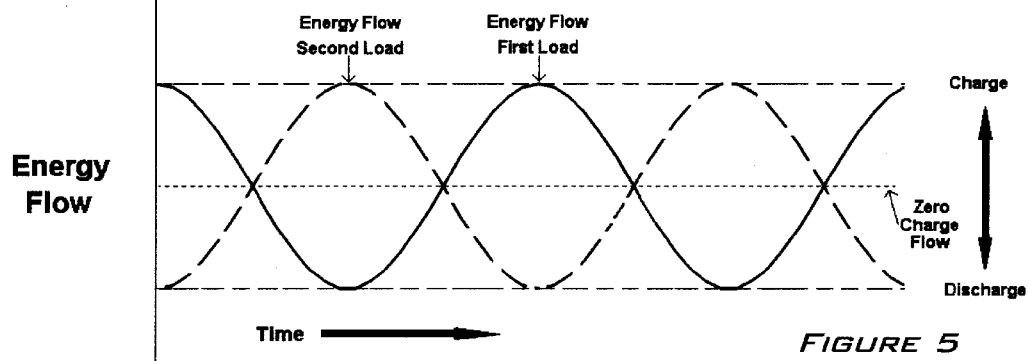
FIG. 5 graphically describes the energy flow waveforms for a typical symmetric load system.
Figure 6:
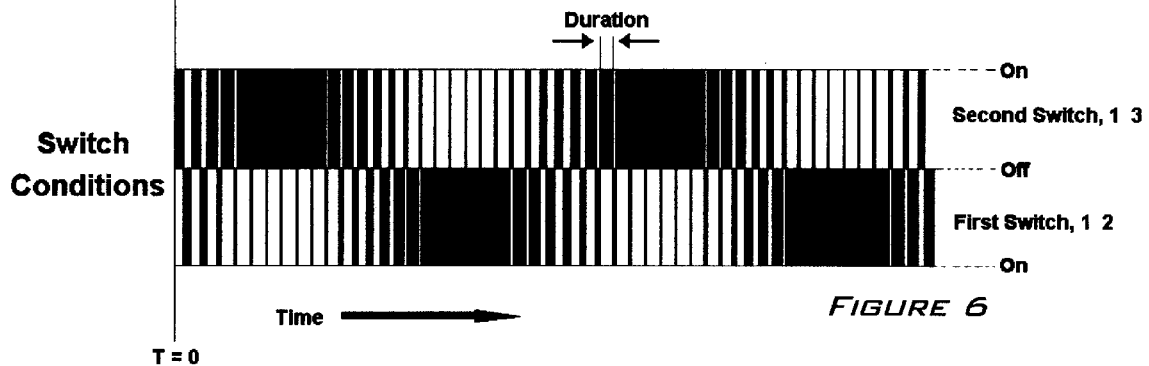
FIG. 6 graphically describes the switch states for a typical symmetric load system.

FIG. 4 describes typical voltage waveforms at both first load 2 and second load 3. FIG. 5 describes typical energy flow waveforms for first load 2 and second load 3. Both Figures assume a sinusoidal command function from the switch controller circuit 10 into the first switch SW1 and the second switch SW2. However, any fixed or variable function is applicable to the present invention. FIG. 6 artistically describes OFF and ON conditions at first switch SW1 and second switch SW2 for waveforms profiles in FIGS. 4 and 5 to aid functional visualization.

The equilibrated charge state is identified in FIG. 4 as a horizontal line with a magnitude V/2 representing one-half the total voltage (V) across the power supply 11. This condition is maintained by the rapid OFF and ON switching of first switch SW1 and second switch SW2 at a constant frequency of equal duty cycle duration. Neither charge nor discharge occur at the equilibrated charge state. Voltage at center tap 4 is one-half of the power supply 11 voltage (V) and at node C 6 is either the power supply 11 voltage (V) or zero.

Charge transfer from the second load 3 to the first load 2 is achieved by increasing the duration of the ON condition at the second switch SW2 thereby causing a corresponding increase in the OFF condition at the first switch SW1. Switching bias increases the discharge of energy at the second load 3 facilitating redirection to the first load 2. Alternatively, charge transfer from the first load 2 to the second load 3 is achieved by increasing the duration of the ON condition at the first switch SW1 thereby causing a corresponding increase in the OFF condition at the second switch SW2. Here, biased switching effectively increases the discharge of energy at the first load 2 and redirects it into the second load 3. The resultant voltage waveforms for both first load 2 and second load 3 are sinusoidal however phase shifted 180 degrees. The total sum voltage at any time is equal to the power supply 11 voltage (V). The energy flow waveforms for first load 2 and second load 3 are also sinusoidal and phase shifted 180 degrees. Additionally, current and energy flow waveforms for each of the first load 2 and second load 3 are phase shifted 90 degrees.

The charge transfer process at the circuit level is the following. When the first switch SW1 is ON and the second switch SW2 is OFF, current in the filter inductor L1, accumulated when the second switch SW2 was ON charging node C 6 to V and center tap 4 to V/2, continues to flow in the positive direction for a short duration into the first switch SW1. Thereafter, the charge direction reverses into the filter inductor L1 since voltage at node C 6 is now zero and the voltage at center tap 4 is V/2. This charge flow pattern effectively "pulls" current from center tap 4 through first load 2 and second load 3 and "pushes" current into the ground 16. When the first switch SW1 is OFF and the second switch SW2 is ON, current in the filter inductor L1, accumulated when the first switch SW1 was ON causing node C 6 to have no voltage and placing center tap 4 at V/2, continues to flow in the negative direction for a short duration into the second switch SW2. Thereafter, the charge direction reverses away from the filter inductor L1 since voltage at node C 6 is now the power supply 11 voltage (V) and the voltage at center tap 4 is one-half the power supply 11 value. This charge flow pattern effectively "pulls" current from node C 6 and "pushes" current through the first load 2 and second load 3. But because the loads are not referenced to the same point, the current causes a differential variation in the loads thereby effectively producing the "pushing" and "pulling" described above.

Figure 7:
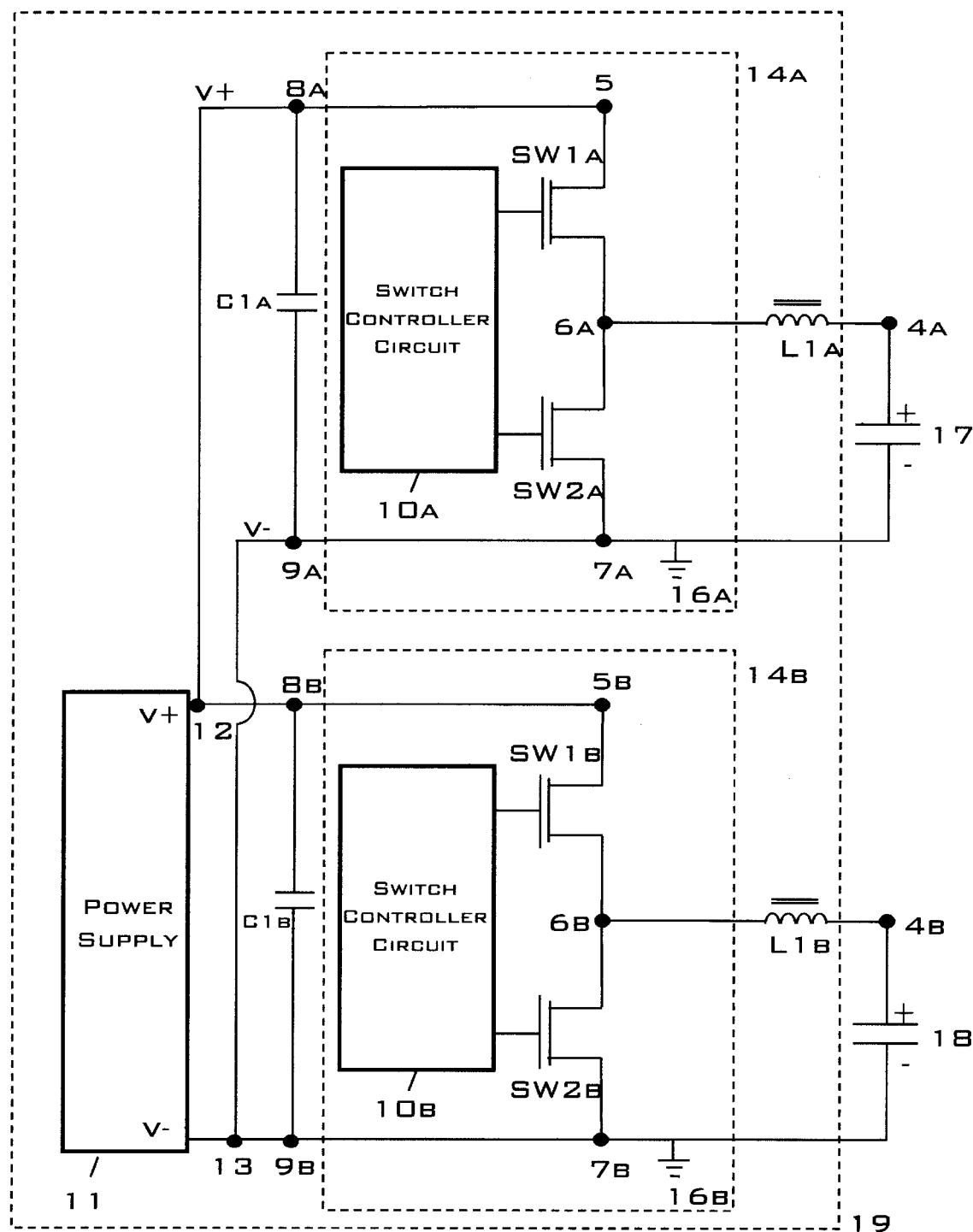
FIG. 7 is a circuit diagram for a dual half-bridge embodiment of the present invention.

FIG. 7 illustrates a dual half-bridge embodiment of the present invention wherein a first single load 17 and a second single load 18 are respectively connected to a filter inductor L1, a regenerative drive 14, and a bypass capacitor C1 and thereafter connected to a common power supply 11 at node H 12 and node I 13. In this embodiment, charge-discharge at the first single load 17 and second single load 18 are independent of one another. When the first switch SW1a is ON and the second switch SW2a is OFF, charge flows from positive to negative across the first single load 17. When the first switch SW1a is OFF and the second switch SW2a is ON, charge flows from negative to positive across the first single load 17. When the first switch SW1b is ON and the second switch SW2b is OFF, charge flows from positive to negative across the second single load 18. When the first switch SW1b is OFF and the second switch SW2b is ON, charge flows from negative to positive across the second single load 18. Alternating functionality between first single load 17 and second single load 18 is achieved by phase shifting command functions from the switch controller circuits 10a and 10b. A 180 degree phase shift is implemented in the preferred embodiment. While the single half-bridge shown in FIG. 3 was applicable to capacitive elements, the dual half-bridge embodiment is applicable to either dually arranged inductive or dually arranged capacitive elements.

Examples 1 through 4 demonstrate implementations of the present invention to symmetric reactive load systems 48.

EXAMPLE I

Figure 8:
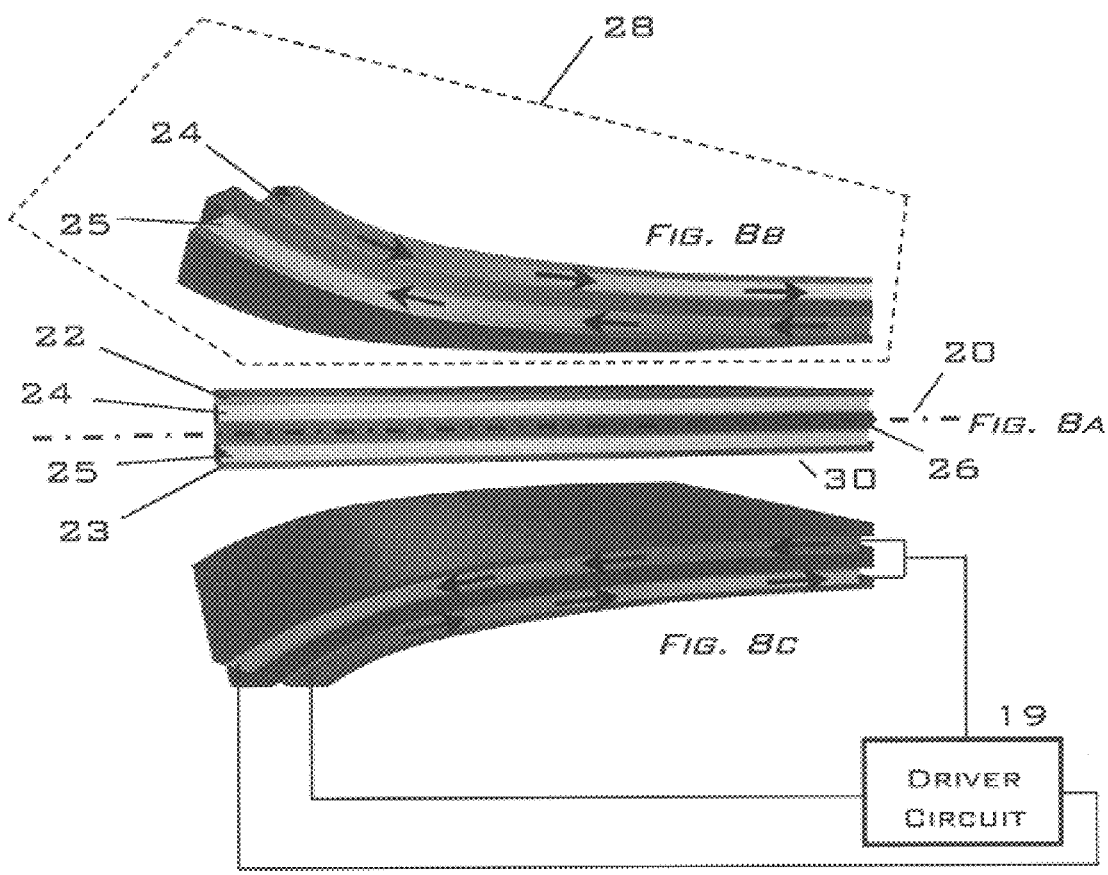
FIG. 8 describes a bimorph embodiment of the present invention.

FIG. 8 describes the extension of the present invention to a new device within the class of referred to as bimorphs. The switchmode power control circuit 1 is a mechanical half-bridge in this system. A bimorph actuator 28 consists of a plurality of planar members about a median axis 20. The preferred embodiment consists of a middle layer 26 sandwiched between a first transductive element 24 and a second transductive element 25. The middle layer 26 is a material sufficient to isolate the first transductive element 24 from the second transductive element 25. Transductive elements 24, 25 may consist of one or more capacitive elements, however the total capacitance of both transductive elements 24, 25 are approximately equal. In the preferred embodiment, a first outer layer 22 and a second outer layer 23 further sandwich the transductive elements 24, 25. The outer layers 22, 23 are any stiff yet flexible homogeneous or composite material with the preferred embodiment being a metal. In the most preferred embodiment, the transductive elements 24, 25 are bonded to the middle layer 26 and outer layers 22, 23.

The bimorph actuator 28 forms a planar configuration 30 either when no charge is applied to the transductive elements 24, 25 or when equal charges are applied within the switchmode power control circuit 1 to the transductive elements 24, 25, as shown in FIG. 8a. The planar configuration 30 is altered via the driver circuit 19 by the charge transfer method. Charge transfer is achieved when the charge balance is altered between transductive elements 24, 25 resulting in biased displacement of the bimorph actuator 28, sometimes referred to as the unimorph effect. FIG. 8b shows upward curvature in the bimorph actuator 28 about the median axis 20 when charge is removed from the first transductive element 24 and applied to the second transductive element 25. FIG. 8c shows downward displacement in the bimorph actuator 28 about the median axis 20 when charge is removed from the second transductive element 25 and applied to the first transductive element 24. Charge flow directions are noted in FIGS. 8b and 8c. The amount of displacement is limited by the charge saturation characteristics of the transductive elements 24, 25 and the stiffness of the bimorph actuator 28.

Figure 9:
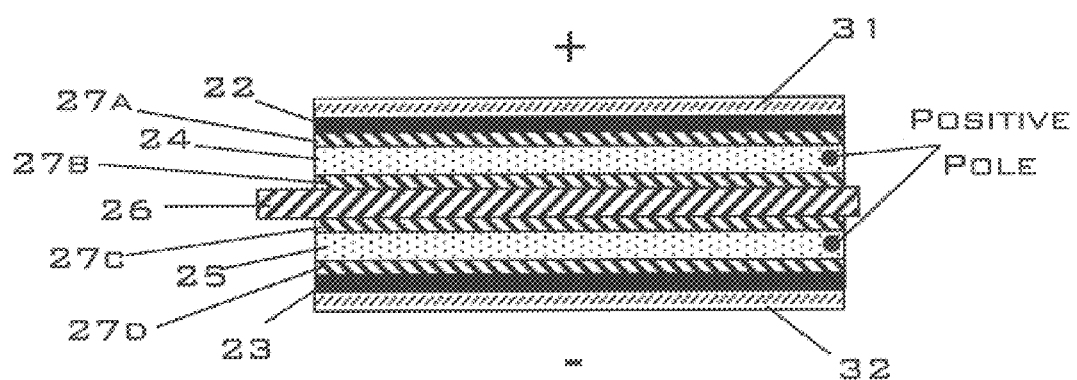
FIG. 9 shows a preferred embodiment of the bimorph embodiment.

FIG. 9 shows a preferred embodiment of the bimorph actuator 28 functioning as an actuator. The pre-stressed bimorph actuator 28 consists of a steel or titanium middle layer 26, a piezoceramic first transductive element 24, a piezoceramic second transductive element 25, an aluminum first outer layer 22, and an aluminum second outer layer 23 wherein layers 22, 23, 26 and elements 24, 25 are bonded by an adhesive 27. In other embodiments, an upper layer 31 and a lower layer 32 are applied to the bimorph actuator 28 consisting of a low-friction material preferably polytetrafluoroethylene. The most preferred embodiment consisting of the following: outer layers 22, 23 being a 1.96 inch wide by a 1.96 inch long by a 0.001 inch thick aluminum, ASTM B20, plate; transductive elements 24, 25 being a 2.04 inch wide by 2.04 inch long by 0.015 inch thick 3195HD ceramic manufactured by the CTS Corporation of Albuquerque, N. Mex.; middle layer 26 being a 3.0 inch wide by 2.24 inch long by 0.02 inch thick stainless steel plate, type 302, ASTM A117; and adhesive 27 being a high temperature polyimide commonly known as LaRC—SI.

The preferred embodiment is assembled with the following process. The outer layers 22, 23 are perforated and cleaned. The piezoceramics are cleaned and sprayed with LaRC—SI solution (e.g., 8% LaRC—SI powder and 92% N-methyl-pyrolidinone) and then dried in an oven. The middle layer 26 is scuffed, primed, piezoceramics applied to the middle layer 26, and outer layers 22, 23 applied to the piezoceramics. A pre-heat step may be used to soften the adhesive 27 and provide the adherence required to keep elements 24, 25 and layers 22, 23, 26 together during assembly. An alcohol solution also serves the same purpose. To insure a uniform bond, a vacuum bagging process is used to plate and fixture as to apply equal pressure onto individual elements while in the autoclave. The bimorph actuator 28 is placed into the autoclave, platen pressed, and subject to a pressure and temperature. During the autoclave cycle, the bimorph actuator 28 is heated, squeezed, cooked, then cooled to room temperature. During cool down, differences in the thermal coefficients of expansion between metals and ceramic creates a stress state within the material resulting in a flat planar configuration 30.

The bimorph actuator 28 is polarized on either the outside of each ceramic or on the top of each ceramic. Three wires are attached to the structure. One wire is attached to the first outer layer 22 thereby providing a positive. A second wire is attached to the second outer layer 23 thereby providing a negative. And a third wire is attached to the middle layer 26 for grounding.

A multilaminar version of the bimorph actuator 28 is realized by the sequential layering of two or more bimorph actuators 28 separated by a frictionless material as described by the upper layer 31 and the lower layer 32. Two electroding options are possible. The first option consists of similarly poling and driving the piezoceramics in parallel on one side of the median axis 20, thereby functioning as the first load 2, and similarly poling and driving the piezocermics in parallel on the opposite side of the median axis 20, thereby functioning as the second load 3. The second option alternates poling and electroding thereby treating odd numbered piezoceramics as the first load 2 and even numbered piezoceramics as the second load 3.

EXAMPLE II

FIG. 10 describes the application of the present invention to a symmetric reactive load system 48 consisting of two identical but opposed induced strain devices. Such systems are referred to as inchworm or bi-static motion devices, and generally identified as two-state machines. The driver circuit 19 functions as a symmetric mechanical half-bridge between a first transductive element 24 and a second transductive element 25. The transductive elements 24, 25 are typically induced strain transducers having equal mechanical and electrical impedance.

FIG. 10a shows a typical two-state machine either when no charge is applied to the transductive elements 24, 25 or when equal charge is applied to the transductive elements 24, 25 via the driver circuit 19. This condition is referred to as the equilibrated charge state. In this example, the length of the transductive elements 24, 25 are altered by redirecting charge, thereby altering the equilibrated charge state, between the transductive elements 24, 25 via the driver circuit 19. In FIG. 10b, charge is removed from the first transductive element 24 and directed into the second transductive element 25. As charge flows from the first transductive element 24 there is a decrease in the induced mechanical strain within the transductive element 24 thereby causing mechanically contractive displacement. As charge flows into the second transductive element 25 there is an increase in the induced mechanical strain within the transductive element 25 thereby causing a mechanically extensive displacement. The degree of displacement is limited by the charge saturation limit of the second transductive element 25. To reverse the mechanical effect, the driver circuit 19 removes charge from the second transductive element 25 and returns it to the first transductive element 24, as shown in FIG. 10c. As the charge on the second transductive element 25 decreases, the mechanical strain causing its extension is reduced causing a corresponding decrease in its length. As the charge on the first transductive element 24 increases, mechanical strain within the transductive element 24 increases causing its extension. The degree of displacement is limited by the charge saturation limit of the first transductive element 24. The driver circuit 19 and its application herein operates quasi-statically, over varying frequency or at resonance and applicable to piezo-motors, precision positioners, z-y stepping systems, and piezo-based differential control isolation systems.

EXAMPLE III

Figure 11:
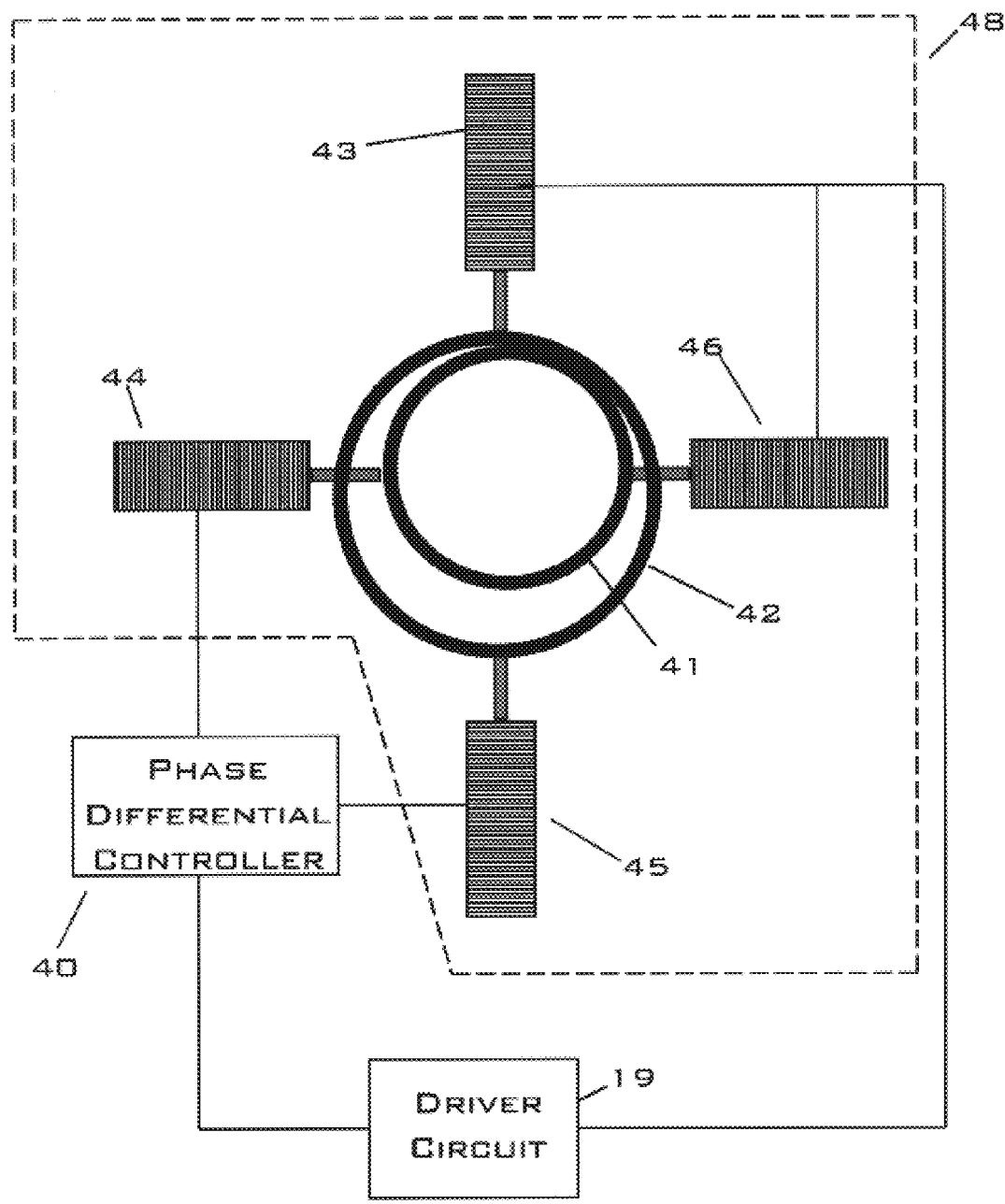
FIG. 11 shows a generic quadrature implementation of the present invention.

FIG. 11 describes the application of the present invention to a symmetric reactive load system 48 consisting of a quadrature arrangement of equal reactance transductive mechanisms sharing identical mechanical and electrical impedance. A first actuator 43, a second actuator 44, a third actuator 45, and a fourth actuator 46 are arranged in a quadrature to produce motion between a first member 41 and a second member 42 via the linear extension and contraction of the actuators 43, 44, 45, 46. Orbital motion between first member 41 and second member 42 is applicable to scroll compressors. Rotational motion between the first member 41 and second member 42 is applicable to MEMS gearing. The actuators 43, 44, 45, 46 are typically induced strain transducers. One embodiment of the symmetric reactive load system 48 consists of two orthogonal actuators, for example the first actuator 43 and the second actuator 44. Another embodiment consists of two pairs of orthogonal arranged actuators 43, 44, 45, 46, as shown in FIG. 11. In the latter embodiment, the first actuator 43 and third actuator 45 are driven in parallel, as well as the second actuator 44 and fourth actuator 46.

The extension and contraction of the actuators 43, 44, 45, 46 are achieved via the driver circuit 19 using the charge transfer method described in Example II. The equilibrated charge state exists either when the charge to the first actuator 43 and the third actuator 45 are equal and the charge to the second actuator 44 and the fourth actuator 46 are equal or when no charge resides in all four actuators 43, 44, 45, 46. A phase differential controller 40 insures a ninety-degree phase shift at the third actuator 45 and the fourth actuator 46.

The driver circuit 19 avoids driving actuator pairs 43 and 45, 44 and 46 at piezo-resonance via a dual half-bridge topology, thereby developing only mechanical resonance.

This mechanical resonance approach uses a single half-bridge output stage in a self-oscillatory system avoiding direct coupling between the energy in the resonant circuit and pressure in the system. The resultant system either operates in an electrically resonant mode or a electrical-mechanical resonant mode. The direct drive mode possesses a simpler method of feedback control than the non-resonant mode. It should be noted that in the direct drive mode the actuators 43, 44, 45, 46 must operate in a bipolar voltage mode.

EXAMPLE IV

Figure 12:
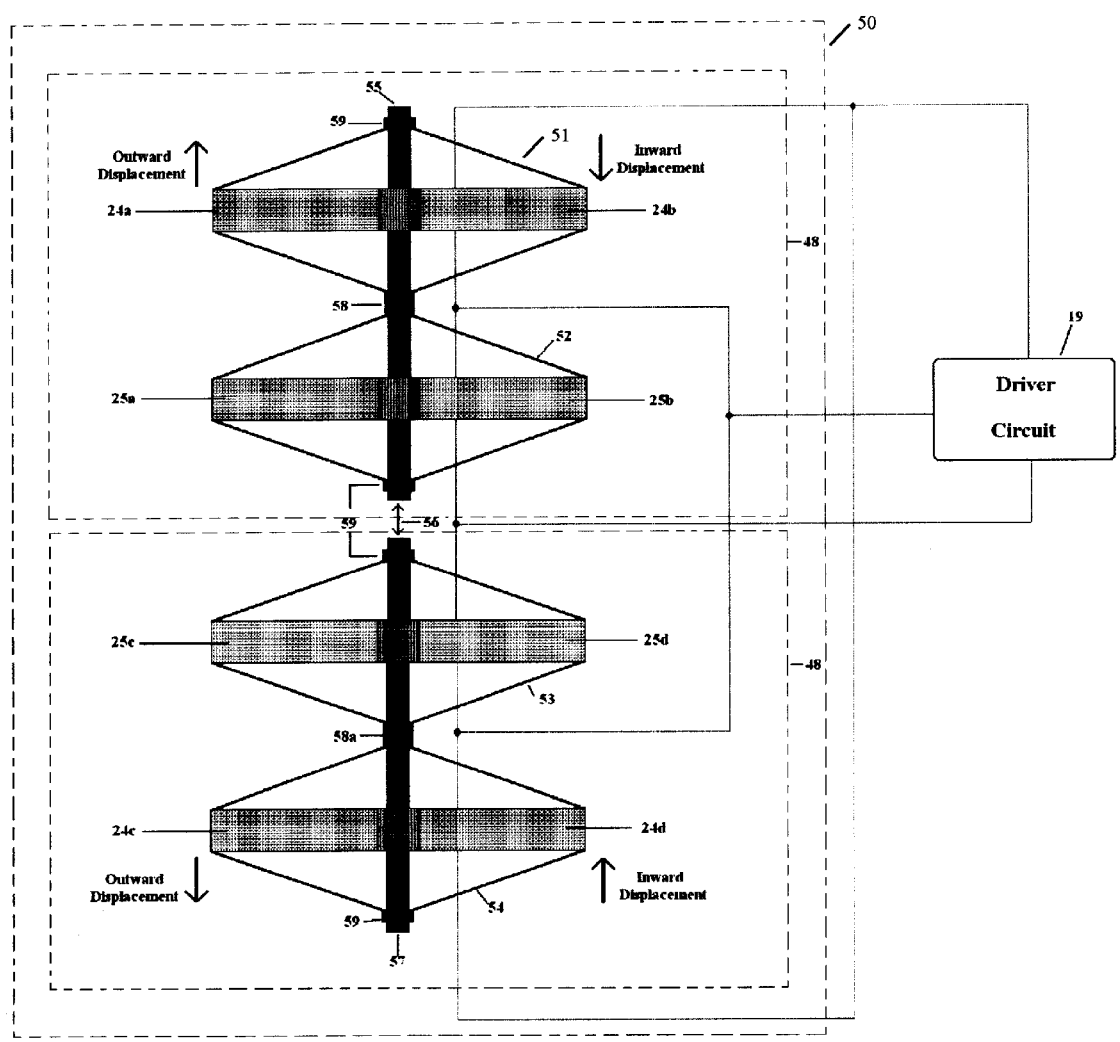
FIG. 12 shows an example piezo-electric activated optical communications device incorporating the present invention.

FIG. 12 describes the application of the present invention to a two-state bidirectional device referred to as a flex tensioner 50. A typical flex tensioner 50 consists of four identical but dually opposed induced strain mechanisms referred to as a first tensioner 51, a second tensioner 52, a third tensioner 53, and a fourth tensioner 54. Each tensioner 51, 52, 53, 54 may consist of one or more transductive elements 24, 25. Extension and contraction of the tensioners 51, 52, 53, 54 are achieved and coordinated via the driver circuit 19 using the charge transfer method described in Example II. An equilibrated charge state exists either when equal charge is applied to each of the tensioners 51, 52, 53, 54 or when no charge is present in all tensioners 51, 52, 53, 54.

In the method of operation of the present invention, the driver circuit 19 transfers charge from first tensioner 51 and fourth tensioner 54 to the second tensioner 52 and third tensioner 53. During charge transfer, an external charge is applied via the driver circuit 19 to maintain the sum total charge in the tensioners 51, 52, 53, 54. Charge depletion in the first tensioner 51 and the fourth tensioner 54 causes the first transverse element 55 and second traverse element 57 to expand in a mechanically amplified fashion due to outward displacement. Simultaneously, charge addition in the second tensioner 52 and the third tension 53 causes the center transverse element 56 to compress along its length in a mechanically amplified fashion due to inward displacement. Mechanical connectors 58 between first tensioner 51 and second tensioner 52 and between third tensioner 53 and fourth tensioner 54 insure compression of the center transverse element 56. Mechanical grounds 59 are positioned along the flex tensioner 50.

Extension of the center transverse element 56 is achieved by diverting charge flow from second tensioner 52 and third tensioner 53 to first tensioner 51 and fourth tensioner 54 via the driver circuit 19. First tensioner 51 and fourth tensioner 54 produce inward displacement adjacent to the first transverse element 55 and the second transverse element 57. Second tensioner 52 and third tensioner 53 produce outward displacement adjacent to the center transverse element 56. The magnitude of compression and extension within the center transverse element 56 is voltage dependent. Voltage and current are monitored at each tensioner 51, 52, 53, 54. Values are analyzed by the driver circuit 19 so that voltage levels are maintained and so that charge compensation is provided to offset mechanical and switching losses.

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

What is claimed is:

1. A switchmode power control circuit for efficiently transferring charge between a first load and a second load of equivalent capacitance coupled in series, said switchmode power control circuit comprising:
    (a) a small filter inductor, said filter inductor storing energy during charge transfer;
    (b) a center tap, said first load negatively terminated at said center tap and positively terminated at a most positive terminal of a power supply, said second load positively terminated at said center tap and negatively terminated at a most negative terminal of said power supply, said filter inductor coupled at one end to said center tap;
    (c) a regenerative drive coupled to said first load, said second load, and said filter inductor, said regenerative drive consisting of a half bridge having symmetric switching topology, said regenerative drive driving charge flow across said center tap; and
    (d) a small bypass capacitor, said bypass capacitor functioning as a reservoir for high-frequency, low-level transients at said power supply.

2. The switchmode power control circuit of claim 1 wherein said small bypass capacitor filters small high-frequency ripple currents related to real power expended from said first load and said second load, said small bypass capacitor filtering requirements independent of said power supply characteristics.

3. The switchmode power control circuit of claim 1 further comprising a means for substantially balancing capacitance between said first load and said second load.

4. A switchmode power control circuit for efficiently transferring charge between a first single load and a second single load of equivalent capacitance, said switchmode power control circuit comprising:
    (a) a first circuit consisting of a filter inductor storing energy during charge transfer, a center tap whereon said first single load is positively terminated, a regenerative drive consisting of a half-bridge with symmetric switching topology coupled to said first single load and said filter inductor providing a non-inverted waveform signal within said first single load, and a small bypass capacitor functioning as a reservoir for high frequency, low-level transients, said first circuit coupled to a power supply; and
    (b) a second circuit consisting of a filter inductor storing energy during charge transfer, a center tap whereon said second single load is positively terminated, a regenerative drive consisting of a half-bridge with symmetric switching topology coupled to said second single load and said filter inductor providing an inverted waveform signal within said second single load, and a small bypass capacitor functioning as a reservoir for high frequency, low-level transients, said second circuit coupled to said power supply.

5. The switchmode power control circuit of claim 4 wherein said small bypass capacitors filter small high-frequency ripple currents related to real power expended from said first single load and said second single load, said small bypass capacitors filtering requirements independent of said power supply characteristics.

6. The switchmode power control circuit as in claim 1, 2, 3, 4, or 5 wherein apparent power is effectively canceled leaving real power only with no power demand associated with apparent power transients.

7. A method for efficiently transferring charge within a symmetric reactive load system, said method comprising the steps of:

(a) applying a charge across said symmetric reactive load system;

(b) generating a voltage gradient across a filter inductor coupled at one end to a center tap;

(c) inducing said charge across said center tap into said symmetric reactive load system symmetrically coupled about said center tap; and (d) inducing said charge across said center tap away from said symmetric reactive load system symmetrically coupled about said center tap.

8. A switchmode power control circuit for efficiently transferring charge within a symmetric reactive load system, said switchmode power control circuit comprising:

(a) a pre-stressed bimorph actuator, said pre-stressed bimorph actuator consisting of a first outer layer, a second outer layer, a middle layer, a first transductive element, and a second transductive element, said first transductive element and said second transductive element bonded to said middle layer, said first outer layer bonded to said first transductive element, said second outer layer bonded to said second transductive element, said pre-stressed bimorph actuator being planar;

(b) a small filter inductor, said filter inductor storing energy during charge transfer;

(c) a center tap, said first transductive element negatively terminated at said center tap and positively terminated at a most positive terminal of a power supply, said second transductive element positively terminated at said center tap and negatively terminated at a most negative terminal of said power supply, said filter inductor coupled at one end to said center tap;

(d) a regenerative drive coupled to said first transductive element, said second transductive element, and said filter inductor, said regenerative drive consisting of a half bridge having symmetric switching topology, said regenerative drive driving charge flow across said center tap; and (e) a small bypass capacitor, said bypass capacitor functioning as a reservoir for high current transients at said power supply.

9. The switchmode power control circuit of claim 8 wherein said first outer layer, said second layer, and said middle layer are metals.

10. The switchmode power control circuit of claim 8 wherein said first outer layer and said second outer layer are aluminum.

11. The switchmode power control circuit of claim 8 wherein said middle layer is stainless steel.

12. The switchmode power control circuit of claim 8 wherein said middle layer is titanium.

13. The switchmode power control circuit of claim 8 wherein said first transductive element and said second transductive element are a piezoceramic.

14. The switchmode power control circuit of claim 8 further comprising an upper layer of polytetrafluoroethylene.

15. The switchmode power control circuit of claim 8 further comprising a lower layer of polytetrafluoroethylene.

16. The switchmode power control circuit of claim 8 wherein said first outer layer, said first transductive element, said middle layer, said second transductive element, and said second outer layer are bonded with an adhesive.

17. The switchmode power control circuit of claim 16 wherein said adhesive is a high temperature polyimide.

18. The switchmode power control circuit as in one of claims 8–17 wherein said first outer layer is positively poled, said second outer layer is negatively poled, said middle layer is neutral.

19. A switchmode power control circuit for efficiently transferring charge between a first load and a second load of equivalent capacitance coupled in series, said switchmode power control circuit comprising:

(a) a small filter inductor, said filter inductor storing energy during charge transfer;

(b) a center tap, said first load negatively terminated at said center tap and positively terminated at a most positive terminal of a power supply, said second load positively terminated at said center tap and negatively terminated at a most negative terminal of said power supply, said filter inductor coupled at one end to said center tap;

(c) a small bypass capacitor, said bypass capacitor functioning as a reservoir for high-frequency, low-level transients at said power supply; and (d) an integrated circuit chip coupled to said filter inductor, said first load, said second load, and said center tap, said integrated circuit chip composed of a regenerative drive with dual embedded MOSFET switches in a half bridge topology and said bypass capacitor, said integrated circuit chip driving charge flow across said center tap.

20. A switchmode power control circuit for efficiently transferring charge between a first load and a second load of equivalent capacitance coupled in series, said switchmode power control circuit comprising:

(a) a small filter inductor, said filter inductor storing energy during charge transfer;

(b) a center tap, said first load negatively terminated at said center tap and positively terminated at a most positive terminal of a power supply, said second load positively terminated at said center tap and negatively terminated at a most negative terminal of said power supply, said filter inductor coupled at one end to said center tap;

(c) a small bypass capacitor, said bypass capacitor functioning as a reservoir for high-frequency, low-level transients at said power supply; and (d) an integrated circuit chip coupled to said filter capacitor, said first load, said second load, and said center tap, said integrated circuit chip composed of a regenerative drive with embedded signal processing and control circuit, dual embedded MOSFET switches in a half bridge topology and said bypass capacitor, and said integrated circuit chip driving charge flow across said center tap.

* * * * *

UNITED STATES PATENT AND TRADEMARK OFFICE
CERTIFICATE OF CORRECTION

PATENT NO. : 6,465,931 B1
DATED : October 15, 2002
INVENTOR(S) : Knowles et al.

It is certified that error appears in the above-identified patent and that said Letters Patent is hereby corrected as shown below:

Column 1,
Line 13, delete "None."
Line 13, insert -- This invention was made with Government support under Contract NAS1-00044 awarded by NASA. The Government has certain rights in this invention. --

Signed and Sealed this

Twenty-ninth Day of June, 2004

JON W. DUDAS
*Acting Director of the United States Patent and Trademark Office*